United States Patent
Nozaki

(10) Patent No.: US 8,237,832 B2
(45) Date of Patent: Aug. 7, 2012

(54) IMAGE SENSOR WITH FOCUSING INTERCONNECTIONS

(75) Inventor: Hidetoshi Nozaki, Sunnyvale, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 380 days.

(21) Appl. No.: 12/130,950

(22) Filed: May 30, 2008

(65) Prior Publication Data

US 2009/0295953 A1 Dec. 3, 2009

(51) Int. Cl.
*H01L 31/0232* (2006.01)
(52) U.S. Cl. .......... 348/294; 257/432; 257/292
(58) Field of Classification Search .......... None
See application file for complete search history.

(56) References Cited

U.S. PATENT DOCUMENTS

| | | | |
|---|---|---|---|
| 4,558,365 A | | 12/1985 | Ochi |
| 5,602,415 A | * | 2/1997 | Kubo et al. ........... 257/443 |
| 7,838,318 B2 | * | 11/2010 | Hannebauer ......... 438/48 |
| 7,906,811 B2 | * | 3/2011 | Otake ............ 257/355 |
| 2003/0063204 A1 | | 4/2003 | Suda |
| 2005/0253045 A1 | | 11/2005 | Oda |
| 2005/0285215 A1 | * | 12/2005 | Lee et al. ............. 257/432 |
| 2006/0170009 A1 | * | 8/2006 | Kitano et al. .......... 257/236 |
| 2006/0261429 A1 | * | 11/2006 | Hasegawa ............. 257/458 |
| 2007/0023799 A1 | | 2/2007 | Boettiger |
| 2007/0057338 A1 | | 3/2007 | Lee et al. |
| 2007/0187787 A1 | * | 8/2007 | Ackerson et al. ........... 257/428 |
| 2008/0001242 A1 | * | 1/2008 | Yamada ............ 257/436 |
| 2008/0036023 A1 | | 2/2008 | Park |
| 2008/0055449 A1 | * | 3/2008 | Nagase et al. ......... 348/311 |
| 2008/0079106 A1 | | 4/2008 | Miyagawa et al. |
| 2011/0042701 A1 | * | 2/2011 | Du Plessis et al. ......... 257/98 |

FOREIGN PATENT DOCUMENTS

EP 1 750 308 A2 2/2007

OTHER PUBLICATIONS

PCT/US2009/043676, PCT International Search Report and Written Opinion of the International Searching Authority, mailed Aug. 19, 2009, 17 pages.
Examination Report for European Patent Application No. 09755615.3 mailed Sep. 23, 2011, 8 pages.
First Office Action for Chinese Patent Application No. 200980120176.8 mailed Mar. 19, 2012, 13 pages (with English Translation).

* cited by examiner

*Primary Examiner* — James Hannett
*Assistant Examiner* — Angel L Garces-Rivera
(74) *Attorney, Agent, or Firm* — Blakely Sokoloff Taylor & Zafman LLP

(57) ABSTRACT

An image sensor includes a photosensitive region formed in a substrate of an integrated circuit. The substrate has a first layer of metal formed over the surface of the substrate so the first layer of metal defines a first aperture that has a first aperture width through with the incident light passes before illuminating the photosensitive region. The first aperture width is equal to or less than the width of the photosensitive region below the first aperture. The substrate also has a second layer of metal formed over the first layer of metal. The second aperture has a second aperture width that is wider than the first aperture width. The first and second apertures focus the incident light onto the photosensitive region.

18 Claims, 7 Drawing Sheets

IMAGE SENSOR WITH FOCUSING INTERCONNECTIONS

This disclosure relates generally to imaging circuits, and more particularly, but not exclusively, relates to image sensors.

BACKGROUND INFORMATION

Integrated circuits have been developed to reduce the size of components used to implement circuitry. For example, integrated circuits have been using ever-smaller design features, which reduces the area used to implement the circuitry, such that design features are now well under the wavelengths of visible light. With the ever-decreasing sizes of image sensors and the individual pixels that are part of a sensing array, it is important to more efficiently capture incident light that illuminates the sensing array. Thus, more efficiently capturing incident light helps to maintain or improve the quality of electronic images captured by the sensing arrays of ever-decreasing sizes.

BRIEF DESCRIPTION OF THE DRAWINGS

Non-limiting and non-exhaustive embodiments of the disclosure are described with reference to the following figures, wherein like reference numerals refer to like parts throughout the various views unless otherwise specified.

DETAILED DESCRIPTION

Figure 1:
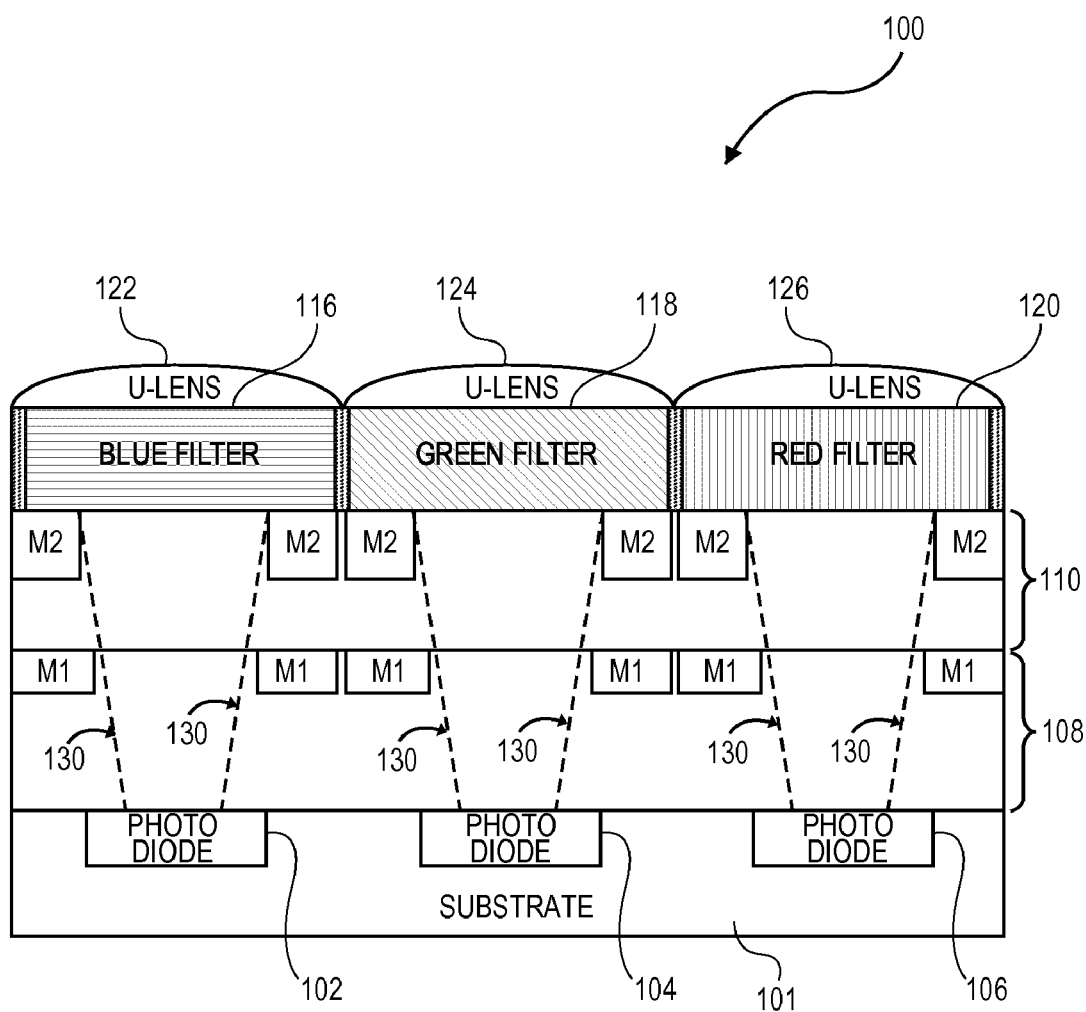
FIG. 1 is an illustration of a side view of a sample frontside illuminated (FSI) image sensor 100.

Embodiments of an image sensor reflector are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. The term "or" as used herein is normally meant to encompass a meaning of an inclusive function, such as "and/or."

In general, integrated circuits comprise circuitry that is employed for a variety of applications. The applications use a wide variety of devices such as logic devices, imagers (including CMOS and CCD imagers), and memory (such as DRAM and NOR- and NAND-based flash memory devices). These devices normally employ transistors for a variety of functions, including switching and amplification of signals.

Transistors are typically formed in integrated circuits by photolithographic processes that are performed on a silicon substrate. The processes include steps such as applying a photographic resist layer to the substrate, exposing the resist layer to a pattern using light (including deep ultra-violet wavelengths), removing the exposed portions (or non-exposed portions depending on the photo-positive or photo-negative resists that are used) of the resist by etching, and modifying the exposed structure, for example, by depositing or implanting additional materials to form various structure for electronic components (including transistors).

The term "substrate" includes substrates formed using semiconductors based upon silicon, silicon-germanium, germanium, gallium arsenide, and the like. The term substrate may also refer to previous process steps that have been performed upon the substrate to form regions and/or junctions in the substrate. The term substrate can also include various technologies, such as doped and undoped semiconductors, epitaxial layers of silicon, and other semiconductor structures formed upon of the substrate.

Chemical-mechanical planarization (CMP) can be performed to render the surface of the modified substrate suitable for forming additional structures. The additional structures can be added to the substrate by performing additional processing steps, such as those listed above.

As the size of the image sensors in individual pixels that are part of a sensing array become increasingly smaller, various designs attempt to more efficiently capture the incident light that illuminates the sensing array. For example, the area of the light sensing element (such as a photodiode region) of a pixel is typically maximized by arranging a microlens over (or underneath) each pixel so that the incident light is better focused onto the light sensing element. The focusing of the light by the microlens attempts to capture light that would otherwise normally be incident upon of the pixel outside the area occupied by the light sensitive element (and thus lost and/or "leaked" through to other unintended pixels).

In accordance with the present disclosure, edges of metal interconnect lines on different levels are used to focus incident light from an illuminated object onto a photosensitivity region of a pixel of an image sensor. At least two levels of metal are used to focus the incident light. The two levels of metal can be metal layers for interconnection and/or metal used for any other purpose that lie between the photosensitive region and the object being imaged.

To illustrate, FIG. 1 is a side view illustrating sample filters arranged in a pattern over an array of photosensitive elements in an image sensor 100. For simplicity, the illustration is not drawn to scale. Generally, the image sensor 100 includes several photosensitive elements arranged in an array of two dimensional rows and columns across a substrate 101. FIG. 1 illustrates three photosensitive elements 102, 104, and 106, which are shown as photodiode regions 102, 104, and 106. The array can include hundreds or thousands of rows and/or columns, or more. Additionally, the array can have an arrangement other than rectilinear columns and rows.

The substrate 101 can be a semiconductor substrate. For many embodiments, the substrate 101 is a doped silicon substrate.

Each photosensitive element 102, 104, and 106 typically converts received light into an electric signal proportional to the intensity of light detected. The photosensitive element can be a photodiode or other solid state device. Other photosensitive elements also can be used as well. The resulting pixels can include, for example, amplification and readout circuitry such as one or more CMOS transistors (not shown). The resulting pixels can be devices having size of around 1.75 microns or smaller. Alternatively, the resulting pixels can be larger. For purposes of clarity, only reference numbers for photosensitive elements 102, 104, and 106 are illustrated. The photosensitive elements 102, 104, and 106 can be disposed in the substrate 101 in any suitable known manner.

A typical individual pixel in the image sensor 100 can include a stack of multiple layers including metal layers, planarization layers, and the like. As shown, the image sensor 100 includes a first metal layer having M1 conductors disposed in a dielectric material 108. For some embodiments, the first metal layer can be etched into the shape of the M1 metal conductors and the M1 conductors can be planarized by polishing. The dielectric material 108 can be deposited and/or grown to fill the gaps between the M1 conductors. The dielectric material 108 can insulate the M1 conductors from the substrate 101.

The dielectric material 108 can be any insulator such as an oxide. For some embodiments, the dielectric material can be a silicon oxide.

The M1 conductors can be copper, aluminum, an aluminum copper mixture, or other material suitable (such as polysilicon) for carrying a signal.

As shown, the image sensor 100 includes a second metal layer having M2 conductors disposed in a dielectric material 110. For some embodiments, the second metal layer can be etched into the shape of the M2 conductors and the M2 conductors can be planarized by polishing. The dielectric material 110 can be deposited and/or grown to fill the gaps between the M2 conductors. The dielectric material 110 can insulate the M1 metal conductors from the M2 metal conductors.

The dielectric material 110 can be any insulator such as an oxide. For some embodiments, the dielectric material can be a silicon oxide.

The M2 conductors can be made of a material suitable for conductors M1.

Additionally, filters are disposed over the layer defined by dielectric material 110. The filters can be aligned with photosensitive elements such that a filter 116 is aligned with the photosensitive element 102, a filter 118 is aligned with the photosensitive element 104, and a filter 120 is aligned with the photosensitive element 106. The dashed lines 130 indicate the alignment of the filters with the photosensitive elements.

The filters 116, 118, and 120 can be arranged in a suitable pattern as described below. Where, for example, the filters 116, 118, and 120 are color filters, the filters 116, 118, and 120 can be arranged in a Bayer pattern. As illustrated, the filter 116 is a blue filter in that substantially allows blue light to pass but blocks substantially all other light in the visible spectrum, the filter 118 is a green filter in that substantially allows green light to pass but blocks substantially all other light in the visible spectrum, and the filter 120 is a red filter in that substantially allows red light to pass but blocks substantially all other light in the visible spectrum. In other embodiments, the filters can be cyan, magenta (as an example of a dichroic filter), yellow, or other suitable filters.

The filters 116, 118, and 120 can be made from any suitable material. One suitable material is an acrylic—such as polymethylmethacrylate (PMMA) or polyglycidylmethacrylate (PGMA)—that has been pigmented or dyed. Other photoresist-type materials that can be dyed or pigmented can also be used for color filters.

In some embodiments, microlenses are disposed over the filters. As shown, a microlens 122 is disposed over the filter 116, a microlens 124 is disposed over the filter 118, and a microlens 126 is disposed over the filter 120. The microlenses are arranged to focus incident light upon the photosensitive elements such that the microlens 122 focuses incident light upon the photosensitive element 102, the microlens 124 focuses incident light upon the photosensitive element 104, and the microlens 126 focuses incident light upon the photosensitive element 106. The microlenses, filters, and other layers can be disposed using any suitable deposition, etching, masking technique as well as planarization, heating, reflow, chemical vapor deposition (CVD), plasma enhanced chemical vapor deposition (PECVD), or other suitable technique.

Image sensors are typically made using layers in the pixel stack that are substantially flat. Generally, when the photodiodes are closer to the surface of the substrate, the greater the amount of light that travels from the filters to the photodiodes. When the electron-hole pairs are formed relatively far away (in the larger provided region) from the photodiode depletion region, the formed electron-hole pairs are more likely to be captured by adjacent photodiodes. The capturing of the formed electron-hole pairs by adjacent photodiodes is a normally undesired effect called blooming (which causes adjacent pixels to appear to be brighter than the "true" value). Accordingly, the probability of blooming increases with the thickness of the silicon substrate, while sensitivity decreases as the thinner silicon substrates are used.

As explained in greater detail (with respect to the Figures below), two levels of metal can be optimally arranged when a larger aperture is formed in an upper layer of metal and smaller aperture is formed in a lower layer of metal. For example, the distance from a vertical center line reference of the photodiode to a higher level metal edge and is greater than the distance from the vertical center line reference to a corresponding lower level metal edge. By adjusting the distance from an edge of a metal structure to the vertical center line reference, an optimum angle for "lensing light" can be formed between the edges of the upper and lower metal edges. The optimum angle can be shown as the angle between the center vertical reference and a line formed by connecting the inside edges of stacked metal structures.

The effect of this arrangement is to create an optical waveguide (by using "lensing" effects of the edges of the metal apertures) to optimally channel light through the metal layers and focus the light upon a photosensitive region of a pixel. As the sizes of design features approach and pass wavelengths of the light to be captured (e.g., as scales of integration increase), the lensing effects of the design features become more pronounced and important. For example, FIG. 4A below illustrates a lower aperture (at 0.5 microns above the substrate) having a width of 1.3 microns through which light having a wavelength of 0.620 microns traverses.

Because crosstalk and leakage problems also become more important with increasing scales of integration, the waveguide can be used to channel light away from regions in the pixel that are susceptible to leakage and/or crosstalk. Accordingly, pixels can be spaced more closely together and/or isolation regions can be formed using diffusion (as compared to using shallow trench isolation regions, for example, which entails more processing steps).

Figure 2:
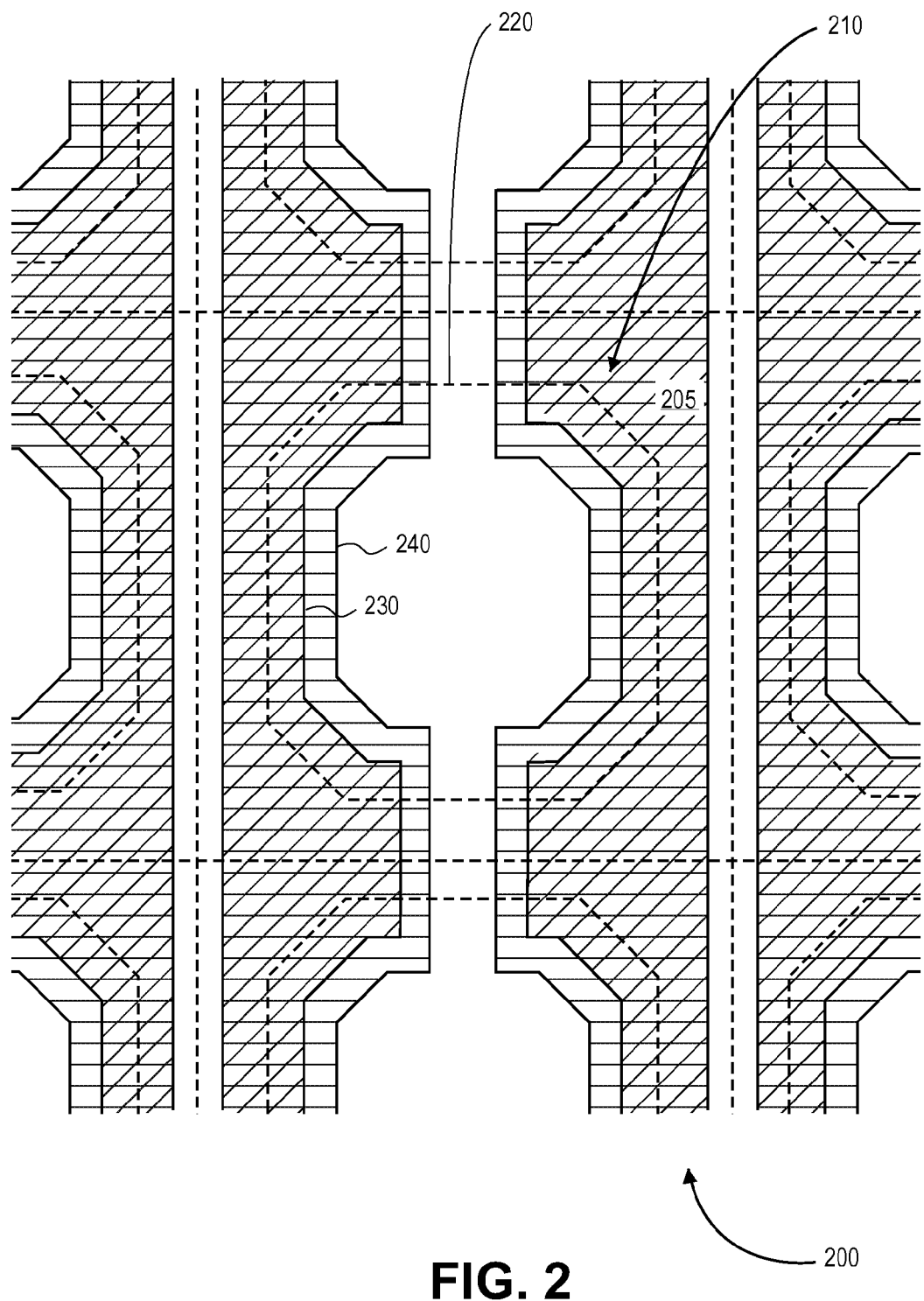
FIG. 2 is an illustration of a top view of a sample sensor array of an image sensor.

FIG. 2 is an illustration of a top view of a portion of a sample sensor array of an image sensor. Array 200 includes pixel 210. Pixel 210 is formed in a substrate that comprises array 200. Array 200 typically contains on the order of thousands or millions of pixels. One pixel is shown for the purpose of clarity. Each pixel can be separated from other pixels by, for example, an isolation region structure 205.

Each pixel includes a photodiode region 220, which is formed in the substrate that comprises array 200. Metalization layers are typically formed in layers that are above (or below) the substrate. Apertures 230 and 240 can be formed in, for example, a first and second metal layers, respectively. In another example, apertures 230 and 240 can be formed in, for example, a first and third metal layers, respectively. The first and second metal layers can be formed using frontside processing and can be patterned using photolithographic processes to define apertures 230 and 240 (respectively). Apertures 230 and 240 lie in a region that is above photodiode region 220 (FIG. 3, described below, provides a cross-sectional view). The metal layers are typically formed within interlayer dielectric layers to provide isolation. As shown in FIG. 2, the entire perimeter of the aperture 240 can be seen from a viewpoint that is above aperture 230. Apertures 230 and 240 can be filled using a translucent material such as silicon dioxide and the like.

Figure 3:
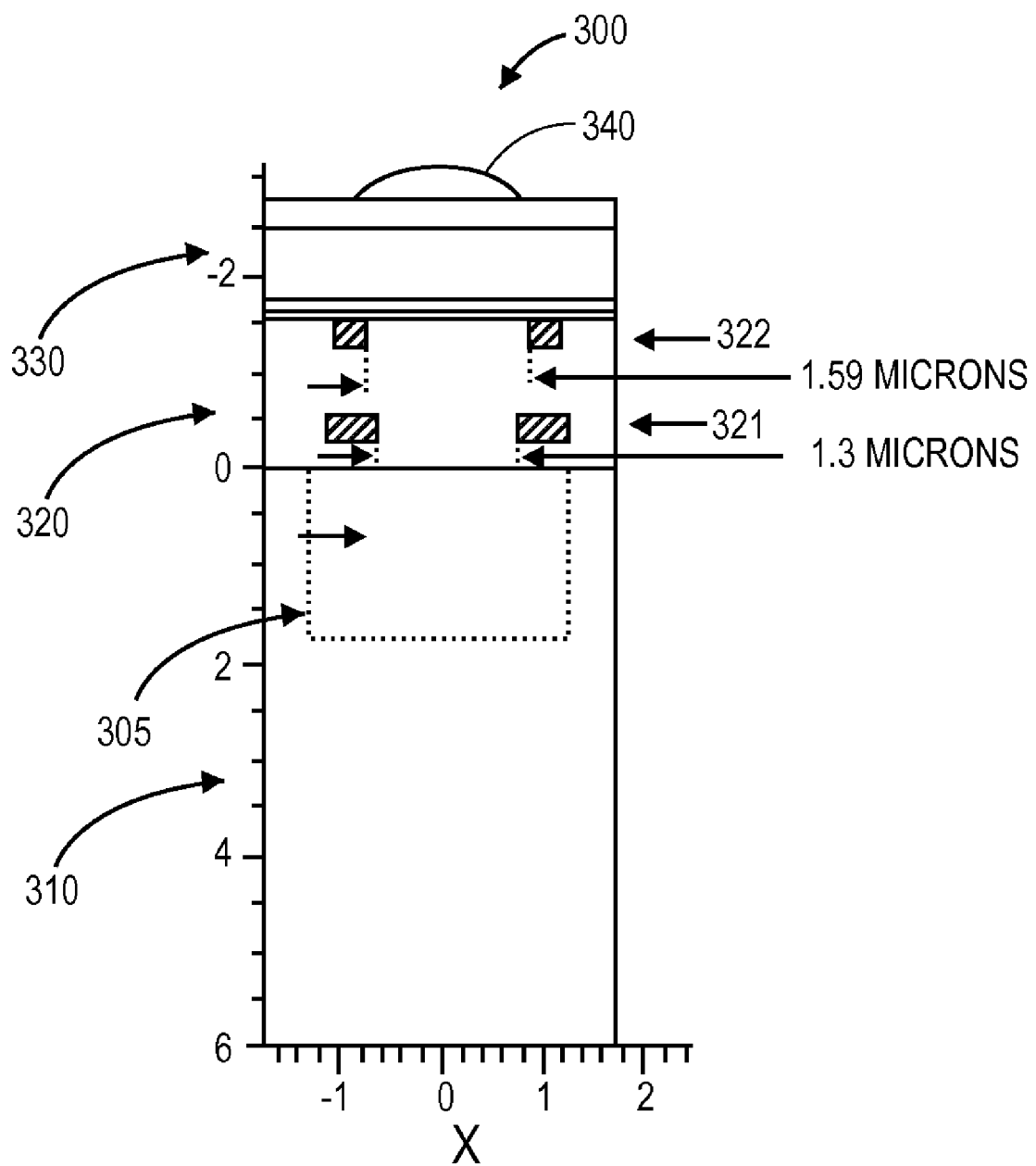
FIG. 3 is an illustration in cross-section of a sample pixel of a sample image sensor.

FIG. 3 is an illustration in cross-section of a sample pixel of a sample image sensor. The pixel 300 is typically arranged in a two-dimensional array (such as array 200) with other pixels such that an electronic image can be formed in response to incident light being captured by a photodiode region 305 in each pixel. Each pixel is formed in a substrate 310, in which photodiode region 305 is formed. The metal layers 321 and 322 are typically formed within interlayer dielectric layers 320 to provide isolation. Filter 330 is a color filter and/or infra-red filter. Filter 330 is used to capture color images or increase the sensitivity of the pixel to certain wavelengths of light, for example.

Figure 4:
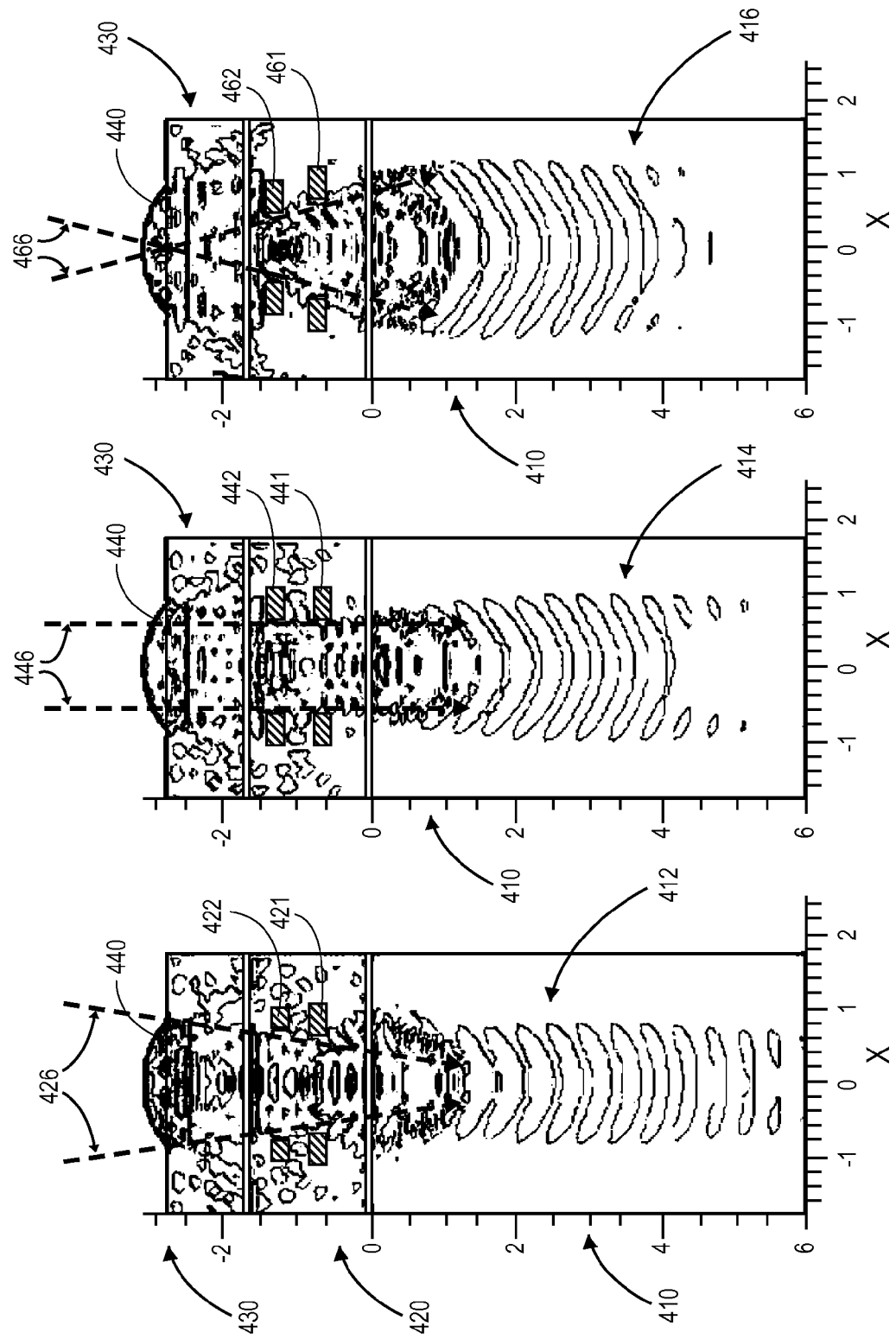
FIG. 4 is an illustration in cross-section of light waves traversing various pixels having differing apertures.

Each pixel can also have a microlens 340 associated with each pixel such that the incident light is more directly guided into the pixel. Incident light traverses the microlens 340 and the color filter 330, which allows light of a selected wavelength to pass through. The light traverses metal/dielectric layers 320 of the pixel and enters photodiode region 305. In the example, the light traverses the apertures 321 and 322 formed in the metalization layers. (Although the apertures in FIG. 3 are shown in cross-section, the aperture shapes can vary across the face of a pixel as viewed from above, such as illustrated in FIG. 2). As illustrated in FIG. 4 below, the light is guided and focused by the relative size and positions of the apertures.

FIG. 4 is an illustration in cross-section of light waves traversing various pixels having differing apertures. FIG. 4A is an illustration in cross-section of light waves traversing a pixel having an upper aperture 422 of 1.59 microns and a lower aperture 421 of 1.3 microns. Thus, the upper aperture is generally wider (and has a larger area) than the lower aperture. The area between opposing edges of the metal layers in each aperture that lies above the photosensitive region can be considered to be the area of each aperture.

The upper aperture is formed at a height of around 1.5 microns (above the surface of the photodiode, which is shown as being at 0 microns on the Y-axis), whereas the lower aperture is formed at a height of around 0.5 microns. Thus the lower aperture is formed above a photosensitive region, for example, at a height that is within a range of the wavelengths of visible light. Accordingly, the edges of the apertures provide a lensing effect to light passing through the apertures. Lines 426 illustrate an angle that is formed by lines tangent to opposing inner edges of both apertures. Lines 426 are shown as converging in a region in the substrate (and/or photodiode region) that is below the apertures.

Incident light (having an example wavelength of around 620 nanometers) passes through microlens 440 such that the incident light is more directly guided into the pixel. The incident light traverses the color filter 430, which allows light of a selected wavelength(s) to pass through. As shown in FIG. 4A, the upper and lower apertures 422 and 421 (formed in metal/dielectric layer 420) provide a lensing effect to the light to produce an interference pattern 412. Pattern 412 illustrates that an upper portion of light is spread initially in the photodiode region (not shown) around the top surface of the substrate (at depths around 0 microns as shown on the vertical scale), while a deeper portion of the light does not spread as it penetrates more deeply into the substrate (at depths from around 1-6 microns). Accordingly, the light is focused onto a photosensitive region of the pixel, which increases the efficiency of the photoconversion. The deeper portion of the light is focused towards the center of the pixel, which increases efficiency and reduces crosstalk (which occurs due to migration of photonically generated electrons to adjacent pixels).

FIG. 4B is an illustration in cross-section of light waves traversing a pixel having an upper aperture 442 of 1.3 microns wide and a lower aperture 441 of 1.3 microns wide. The upper aperture is formed at a height of around 1.5 microns, whereas the lower aperture is formed at a height of around 0.5 microns. Thus the (example) upper aperture is the same width as the lower aperture. Lines 446 illustrate a vertical angle that is formed by lines tangent to edges of both apertures. Lines 446 are shown as being parallel, and thus do not converge in the substrate.

Incident light (having an example wavelength of around 620 nanometers) passes through the microlens 440 such that the incident light is more directly guided into the pixel. The incident light traverses the color filter 430, which allows light of a selected wavelength(s) to pass through. As shown in FIG. 4B, the upper and lower apertures 442 and 441 provide a lensing effect to the light to produce an interference pattern 414. Pattern 414 illustrates that an upper portion of light is spread initially at the width of the apertures (442 and 441) at the top surface of substrate 410, while a deeper portion of the light spreads to a width of over 2 microns as the light penetrates more deeply into the substrate (at depths from around 1-6 microns). Accordingly, the deeper portion of the light spreads away from a vertical center axis (at 0 microns of the X-axis) of the pixel, which increases crosstalk (which occurs due to migration of the photonically generated electrons to adjacent pixels).

FIG. 4C is an illustration in cross-section of light waves traversing a pixel having an upper aperture 462 of 1.0 microns and a lower aperture 461 of 1.3 microns. The upper aperture is formed in metal/dielectric layer 420 at a height of around 1.5 microns, whereas the lower aperture is formed at a height of around 0.5 microns. Thus the (example) upper aperture is smaller than the lower aperture. Lines 466 illustrate an angle that is formed by lines tangent to opposing inner edges of both apertures. Lines 466 are shown as diverging in a region in the substrate (and/or photodiode region) that is below the apertures.

Incident light (having an example wavelength of around 620 nanometers) passes through the microlens 440 such that the incident light is more directly guided into the pixel. The incident light traverses the color filter 430, which allows light of a selected wavelength(s) to pass through. As shown in FIG. 4C, the upper and lower apertures 462 and 461 provide a lensing effect to the light to produce an interference pattern 416. Pattern 416 illustrates that an upper portion of light is spread initially around the top surface of substrate 410 (at depths around 0 microns), while a deeper portion of the light spreads to a width of over 2 microns as the light penetrates more deeply into the substrate (at depths from around 1-6 microns). Accordingly, the deeper portion of the light is spread away from the center (as measured at 0 microns of the X-axis) of the pixel, which increases crosstalk (which occurs due to migration of the photonically generated electrons to adjacent pixels).

Figure 5:
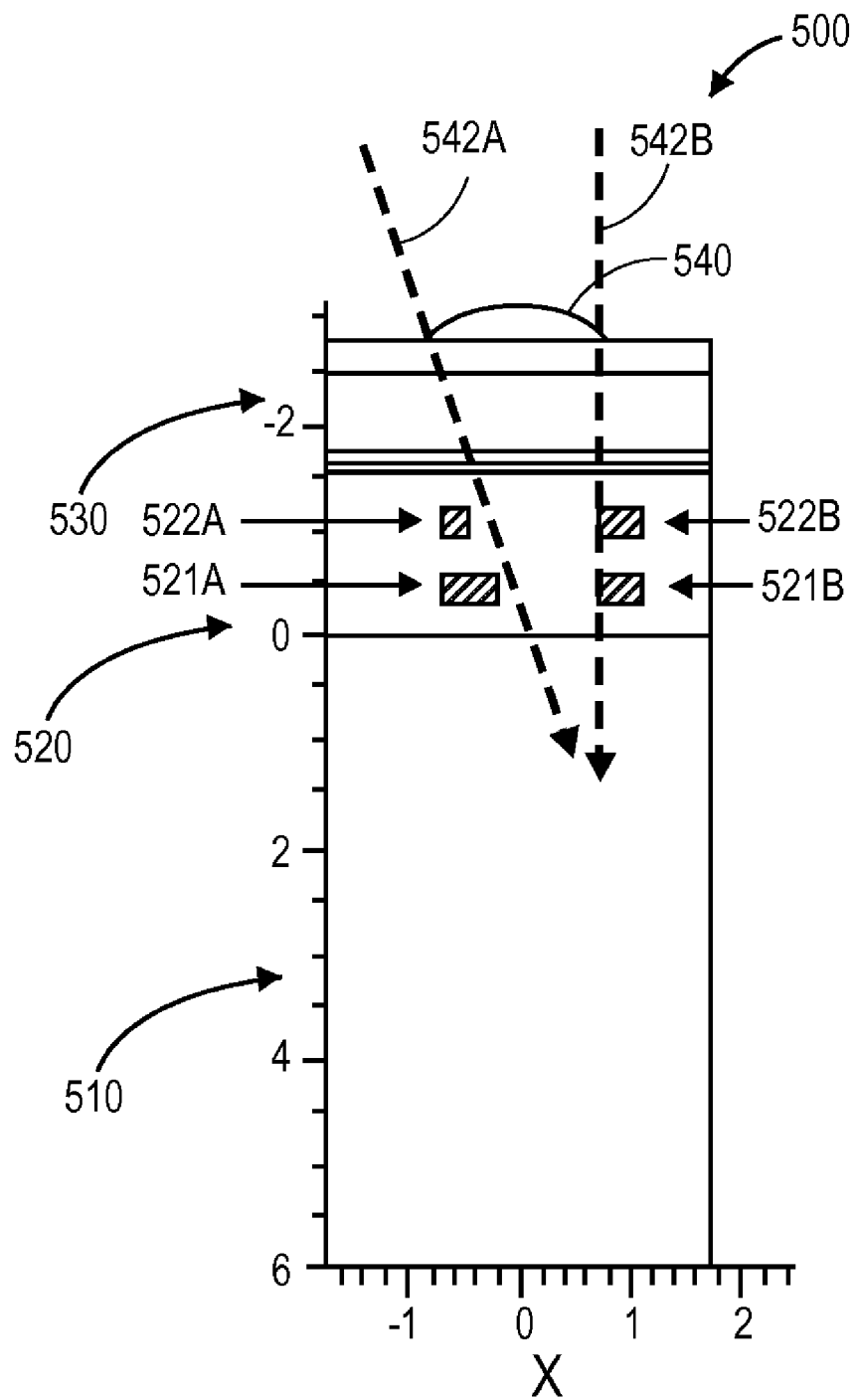
FIG. 5 is an illustration in cross-section of another sample pixel of a sample image sensor.

FIG. 5 is an illustration in cross-section of a pixel having an upper aperture 522A/522B width of 1.59 microns and a lower aperture width 521A/521B of 1.3 microns. Pixel 500 includes a substrate 510, metal/dielectric layer 520, color filter 530, and microlens 540. The upper aperture is formed in metal/dielectric layer 520 at a height of around 1.5 microns, whereas the lower aperture is formed at a height of around 0.5 microns.

As shown, the lower aperture is disposed with the inside edge of 521B aligned vertically with respect to the inside edge of 522B as shown by line 542B. Also, the lower aperture is disposed with the inside edge of 521A aligned diagonally with respect to the inside edge of 522A as shown by line 542A. Thus, the upper aperture is larger than the lower aperture, which results in diminished spreading of incident light that deeply penetrates the substrate. Lines 542A and 542B are shown as converging in a region in the substrate (and/or photodiode region) that is below the apertures. The deeper portion of the light is focused towards the center of the pixel, which increases efficiency and reduces crosstalk (which occurs due to migration of electrons to adjacent pixels).

Figure 6:
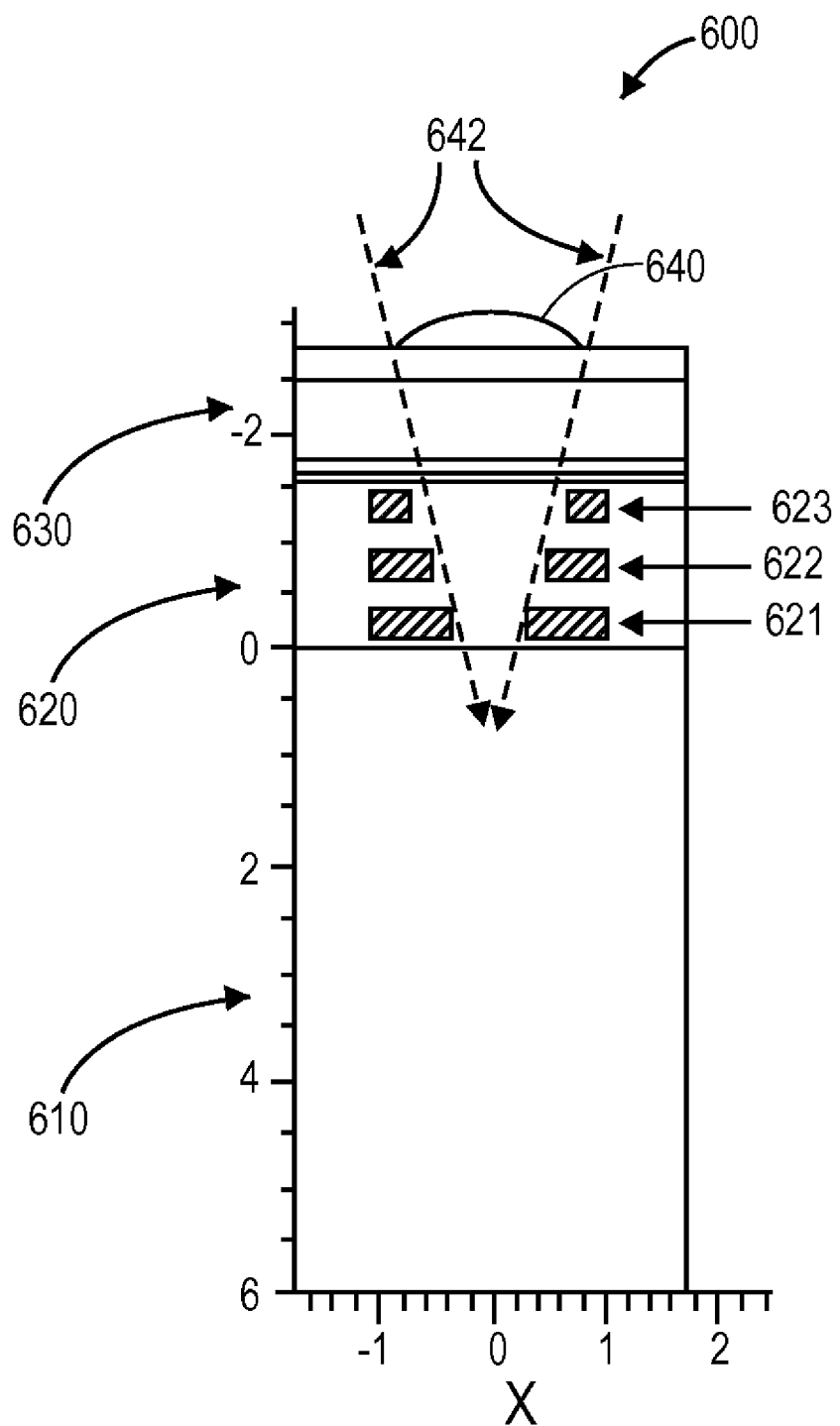
FIG. 6 is an illustration in cross-section of a pixel having an aperture formed by three layers of metal.

FIG. 6 is an illustration in cross-section of a pixel having an aperture formed by three layers of metal. An upper aperture 623 width is 1.59 microns and a lower aperture 621 width is 1.3 microns. A middle aperture 622 is formed in a layer between the layer of the upper aperture 623 and the layer of the lower aperture 621. The middle aperture 622 has width that is at least larger in than the lower aperture 621 width. In the example, the width of the aperture 622 is the numerical average of the widths of the upper and lower apertures such that a line 642 can be drawn that tangentially intersects an inner edge of the upper, middle, and lower apertures. In another embodiment, line 642 does not intersect with an inner edge of the middle aperture.

Pixel 600 includes a substrate 610, metal/dielectric layer 620, color filter 630, and microlens 640. The upper aperture is formed in metal/dielectric layer 620 at a height of around 1.5 microns, whereas the lower aperture is formed at a height of around 0.5 microns. The middle aperture is formed at a height of around 0.75 microns. Accordingly, lensing can be accomplished as discussed above with respect to FIG. 4A. The light is focused by the inner edges of the upper, middle, and lower apertures onto a photosensitive region of the pixel, which increases the efficiency of the photoconversion of the photosensitive region. A deeper portion of the light is focused towards the center of the pixel, which increases the efficiency and reduces crosstalk because the photonically generated electrons are more likely to be captured by the photosensitive region rather than traversing to adjacent pixels.

Figure 7:
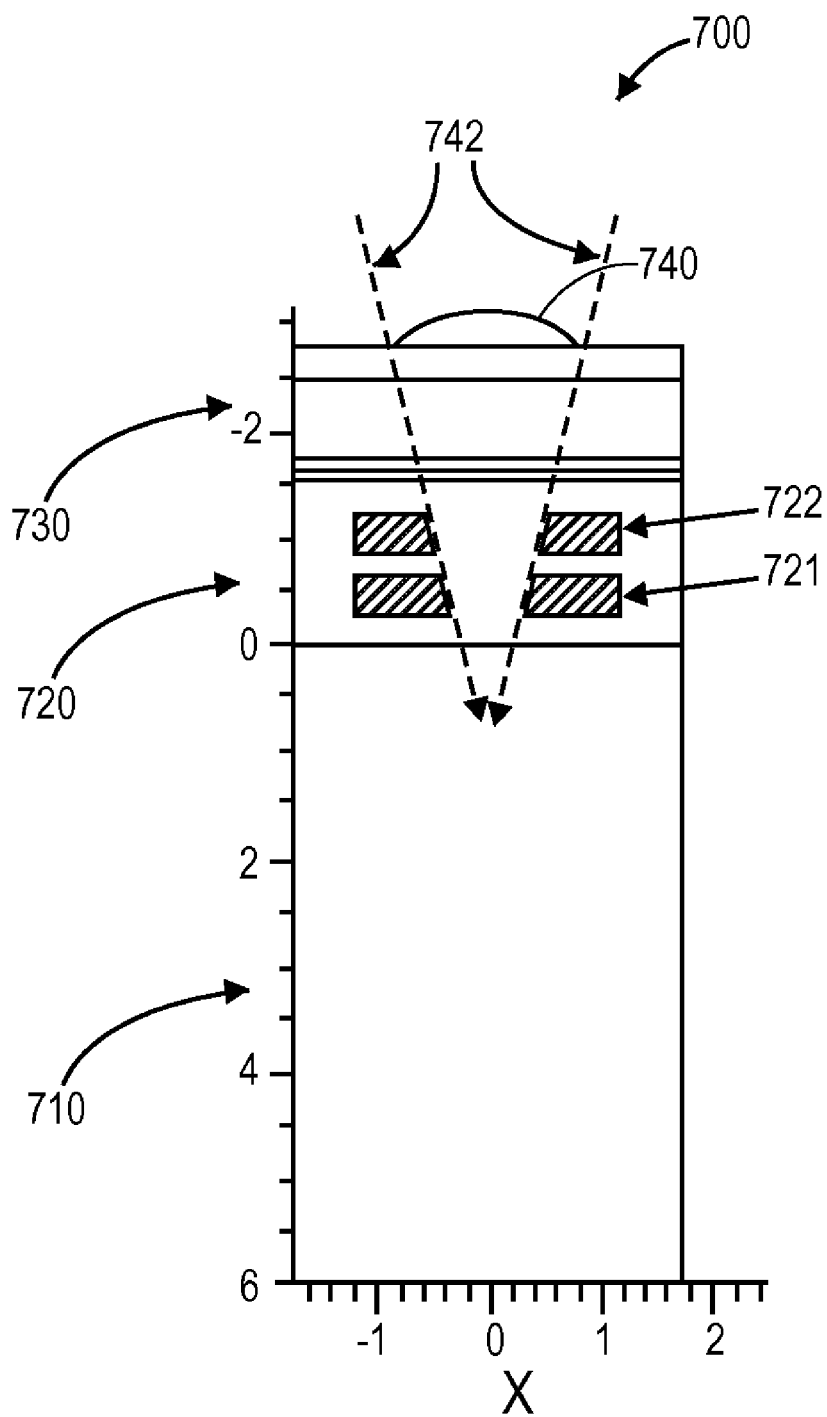
FIG. 7 is an illustration in cross-section of a sample pixel having an aperture formed by two layers of metal with beveled edges.

FIG. 7 is an illustration in cross-section of a sample pixel having an aperture formed by two layers of metal with beveled edges. An upper aperture 722 width is 1.59 microns and a lower aperture 721 width is 1.3 microns. The metal edges of the apertures in the example can be beveled using anisotropic etching. For example, the etching process can use an energized process gas containing halogen for etching the metal edges of the apertures. A hydrocarbon inhibitor gas having a carbon-to-hydrogen ratio of from about 1:1 to about 1:3 can be used to deposit an inhibitor on etched metal features to achieve anisotropic etching.

The etching of the metal edges forms an angle that is illustrated by lines 742 tangent to opposing inner edges of both apertures. Thus, the first and second layers of metal are beveled such that the angle of the bevel has a slope type that is positive or negative that has the same slope type (positive or negative) as a line tangent (e.g., one of lines 742) to the inner edge of adjacent edges of the first and second apertures. Lines 742 are shown as converging in a region in the substrate (and/or photodiode region) that is below the apertures.

Pixel 700 includes a substrate 710, metal/dielectric layer 720, color filter 730, and microlens 740. The upper aperture is formed in metal/dielectric layer 720 at a height of around 1.5 microns, whereas the lower aperture is formed at a height of around 0.5 microns. Accordingly, lensing can be accomplished as discussed above with respect to FIG. 4A. The light is focused by the inner edges of the upper and lower apertures onto a photosensitive region of the pixel, which increases the efficiency of the photoconversion of the photosensitive region. A deeper portion of the light is focused towards the center of the pixel, which increases the efficiency and reduces crosstalk because the photonically generated electrons are more likely to be captured by the photosensitive region rather than traversing to adjacent pixels.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. An image sensor, comprising:
 a substrate having a surface at which incident light is received; and
 a pixel array formed over and within the substrate, the pixel array including pixels, each pixel including:
 a photosensitive region having a sensor area disposed in the substrate;
 an isolation region disposed within the substrate in a region around the photosensitive region and that is adjacent to isolation regions of adjacent pixels to isolate the adjacent pixels from each other, wherein the isolation region is a dopant diffusion region without a trench isolation;
 a first layer of metal formed over the surface of the substrate, the first layer of metal defining a first aperture that has a first aperture area through which the incident light passes before illuminating the photosensitive region; and
 a second layer of metal formed over the first layer of metal, the second aperture defining a second aperture that has a second aperture area that is larger than the first aperture area, wherein the first and second apertures focus the incident light onto the photosensitive region and away from isolation region,
 wherein the first and second apertures include beveled edges on inner edges of the first and second apertures, the beveled edges having a slope that matches a line tangent to the inner edges of both the first and second apertures.

2. The apparatus of claim 1, further comprising a microlens that is disposed over a layer that is above the second layer of metal.

3. The apparatus of claim 1, further comprising a third layer of metal that is formed over the first layer of metal and is formed below the second layer of metal.

4. The apparatus of claim 3, wherein the third layer of metal defines a third aperture having a third aperture area that is larger than the first aperture area.

5. The apparatus of claim 4, wherein the third aperture area is smaller than the second aperture area.

6. The apparatus of claim 1, wherein the entire perimeter of the first aperture is visible when viewed from above the second aperture.

7. The apparatus of claim 1, wherein a width of the first aperture is less than three times a wavelength of the incident light.

8. The apparatus of claim 1, wherein the first aperture is octagonal.

9. The apparatus of claim 1, wherein the second aperture has a width that is at least 20% larger than the first aperture.

10. The apparatus of claim 1, wherein lines tangent to opposing inner edges of the first and second apertures intersect in the substrate.

11. The apparatus of claim 10, wherein the lines tangent intersect in the sensor area.

12. The apparatus of claim 10, wherein the width of the first aperture is larger than one wavelength of the incident light or less than three times a wavelength of the incident light.

13. The apparatus of claim 1, wherein the first and second apertures focus the incident light more widely at a shallower depth of the substrate and more narrowly at a deeper depth of the substrate.

14. A method, comprising:
receiving incident light in a photosensitive region of each pixel of a pixel array of an image sensor, wherein each pixel of the pixel array is disposed within a substrate layer and separated from other pixels of the pixel array by an isolation region within the substrate layer, wherein the isolation region is a dopant diffusion region without a trench isolation;
lensing the incident light using a first aperture having a first aperture area through which the incident light passes before illuminating the photosensitive region;
lensing the incident light using a second aperture having a second aperture area that is larger than the first aperture area, wherein the second aperture is above the first aperture, and wherein the first and second apertures focus the incident light onto the photosensitive region and away from the isolation region, wherein the first and second apertures include beveled edges on inner edges of the first and second apertures, the beveled edges having a slope that matches a line tangent to the inner edges of both the first and second apertures.

15. The method of claim 14, further comprising lensing the received incident light using a third layer of metal formed over the first layer of metal and formed below the second layer of metal.

16. The method of claim 14, wherein the first and second apertures focus the incident light more widely at a shallower depth of the substrate and more narrowly at a deeper depth of the substrate.

17. An apparatus, comprising:
a photosensitive region formed in a substrate of an integrated circuit;
a first layer of metal formed over the surface of the substrate, the first layer of metal defining a first aperture that has a first aperture width through with the incident light passes before illuminating the photosensitive region, wherein the first aperture width is less than the width of the photosensitive region below the first aperture; and
a second layer of metal formed over the first layer of metal, the second aperture defining a second aperture that has a second aperture width that is wider than the first aperture width, wherein the first and second apertures focus the incident light onto the photosensitive region, wherein the first and second layers of metal include beveled edges on inner edges of the first and second apertures, the beveled edges having a slope that matches a line tangent to the inner edges of both the first and second apertures.

18. The apparatus of claim 17, wherein the first and second apertures focus the incident light more widely at a shallower depth of the substrate and more narrowly at a deeper depth of the substrate.

* * * * *